(12) United States Patent
Criss

(10) Patent No.: US 10,606,690 B2
(45) Date of Patent: Mar. 31, 2020

(54) MEMORY CONTROLLER ERROR CHECKING PROCESS USING INTERNAL MEMORY DEVICE CODES

(71) Applicant: Intel Corporation, Santa Clara, CA (US)

(72) Inventor: Kjersten E. Criss, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,252

(22) Filed: Sep. 29, 2017

(65) Prior Publication Data

US 2019/0102246 A1    Apr. 4, 2019

(51) Int. Cl.
| | | |
|---|---|---|
| *G11C 29/00* | (2006.01) | |
| *G06F 11/10* | (2006.01) | |
| *G11C 29/52* | (2006.01) | |
| *G11C 5/04* | (2006.01) | |
| *G11C 29/04* | (2006.01) | |
| *G11C 29/42* | (2006.01) | |

(52) U.S. Cl.
CPC ...... *G06F 11/1004* (2013.01); *G06F 11/1044* (2013.01); *G06F 11/1048* (2013.01); *G06F 11/1064* (2013.01); *G06F 11/1068* (2013.01); *G11C 5/04* (2013.01); *G11C 29/52* (2013.01); *G11C 29/42* (2013.01); *G11C 2029/0409* (2013.01); *G11C 2029/0411* (2013.01)

(58) Field of Classification Search
CPC ... G06F 11/1004; G06F 11/1068; G11C 29/52
See application file for complete search history.

(56) References Cited

U.S. PATENT DOCUMENTS

| | | | |
|---|---|---|---|
| 5,267,241 A | 11/1993 | Kowal | |
| 8,261,159 B1 * | 9/2012 | Sommer | G06F 11/1048 713/193 |
| 9,626,244 B2 | 4/2017 | Sohn et al. | |
| 2011/0010603 A1 | 1/2011 | Yang | |
| 2011/0041039 A1 * | 2/2011 | Harari | G06F 11/1068 714/773 |
| 2012/0096333 A1 * | 4/2012 | Kang | G06F 11/1068 714/773 |

(Continued)

OTHER PUBLICATIONS

Extended European Search Report for Patent Application No. 18191348.4, dated Feb. 20, 2019, 11 pages.

(Continued)

*Primary Examiner* — Samir W Rizk
(74) *Attorney, Agent, or Firm* — Compass IP Law PC (57) ABSTRACT

An apparatus is described. The apparatus includes a memory controller to receive data from a memory device. The memory controller includes error checking logic circuitry. The error checking logic circuitry is to receive an error checking code from the memory device. The error checking code is generated within the memory device from the data. The error checking logic circuitry includes circuitry to generate a second version of the error checking code from the data that was received from the memory device and compare the received error checking code with the second version of the error checking code to understand if the data that was received from the memory controller is corrupted.

20 Claims, 10 Drawing Sheets

---

Reading data and an ECC code from a DIMM, the data includes data components provided by respective memory devices on the DIMM, the ECC code is provided by a respective memory device on the DIMM 501

Recalculating a second version of the ECC code from the data components, the recalculating includes applying different data scrambling to different ones of the data components 502

Recognizing that the ECC code and the second version of the ECC code do not match 503

Receiving respective ECC codes from the memory devices in order to correct a corruption in the data, the respective ECC codes originally generated within the memory devices 504

(56) References Cited

U.S. PATENT DOCUMENTS

| | | | |
|---|---|---|---|
| 2013/0315397 A1* | 11/2013 | Tuers | G06F 11/1012 380/287 |
| 2014/0122777 A1* | 5/2014 | Oh | G06F 3/0661 711/103 |
| 2014/0173369 A1* | 6/2014 | Chen | G11C 7/24 714/718 |
| 2014/0250348 A1 | 9/2014 | Harari et al. | |
| 2015/0278004 A1* | 10/2015 | Li | G11C 29/42 714/6.11 |
| 2016/0134307 A1 | 5/2016 | Hu et al. | |
| 2017/0024162 A1* | 1/2017 | Lim | G06F 11/1048 |
| 2017/0192844 A1 | 7/2017 | Lea et al. | |
| 2018/0358989 A1* | 12/2018 | Mehra | H03M 13/6505 |

OTHER PUBLICATIONS

Nair, et al., "XED: Exposing On-Die Error Detection Information for Strong Memory Reliability", 2013 21st International Conference on Program Comprehension (ICPC): International Symposium on Computer Architecture, (ISCA), IEEE, US, Jun. 18, 2016 pp. 341-353.

* cited by examiner

| bit | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 |
|---|---|---|---|---|---|---|---|---|---|---|---|---|---|---|---|---|---|---|---|---|---|---|---|---|---|---|---|---|---|
| CB0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 |
| CB1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 |
| CB2 | 1 | 0 | 0 | 0 | 0 | 0 | 1 | 1 | 1 | 0 | 0 | 0 | 0 | 0 | 0 | 0 | 0 | 0 | 0 | 0 | 0 | 0 | 1 | 1 | 1 | 1 | 1 | 0 | 1 |
| CB3 | 1 | 0 | 0 | 0 | 0 | 0 | 0 | 0 | 0 | 0 | 0 | 0 | 0 | 0 | 1 | 0 | 0 | 0 | 1 | 0 | 0 | 0 | 1 | 1 | 0 | 0 | 0 | 1 | 0 |
| CB4 | 0 | 1 | 1 | 0 | 0 | 0 | 1 | 1 | 0 | 0 | 0 | 0 | 0 | 1 | 0 | 1 | 1 | 1 | 1 | 0 | 0 | 0 | 1 | 0 | 0 | 0 | 0 | 1 | 0 |
| CB5 | 0 | 0 | 0 | 1 | 0 | 0 | 0 | 0 | 0 | 0 | 0 | 0 | 1 | 0 | 0 | 1 | 0 | 0 | 0 | 1 | 1 | 0 | 0 | 1 | 1 | 1 | 0 | 0 | 1 |
| CB6 | 0 | 0 | 0 | 0 | 1 | 0 | 0 | 0 | 1 | 0 | 1 | 0 | 0 | 0 | 0 | 0 | 1 | 0 | 1 | 1 | 0 | 1 | 0 | 0 | 0 | 1 | 0 | 0 | 1 |
| CB7 | 0 | 0 | 0 | 0 | 0 | 1 | 0 | 0 | 0 | 0 | 0 | 0 | 0 | 0 | 1 | 0 | 0 | 1 | 1 | 0 | 1 | 0 | 0 | 0 | 0 | 0 | 1 | 0 | 1 |

| bit | 64 | 65 | 66 | 67 | 68 | 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 | 92 |
|---|---|---|---|---|---|---|---|---|---|---|---|---|---|---|---|---|---|---|---|---|---|---|---|---|---|---|---|---|---|
| CB0 | 1 | 1 | 1 | 1 | 0 | 1 | 1 | 1 | 1 | 1 | 1 | 1 | 1 | 1 | 1 | 1 | 1 | 1 | 1 | 1 | 1 | 1 | 1 | 1 | 0 | 1 | 1 | 1 | 1 |
| CB1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 | 0 | 0 |
| CB2 | 1 | 1 | 1 | 0 | 1 | 0 | 1 | 0 | 0 | 0 | 1 | 0 | 0 | 0 | 0 | 0 | 0 | 0 | 1 | 1 | 1 | 1 | 1 | 1 | 1 | 0 | 1 | 1 | 1 |
| CB3 | 0 | 0 | 0 | 0 | 1 | 0 | 0 | 1 | 1 | 0 | 0 | 1 | 0 | 0 | 0 | 0 | 0 | 0 | 1 | 1 | 1 | 0 | 0 | 0 | 1 | 0 | 1 | 0 | 0 |
| CB4 | 1 | 1 | 1 | 0 | 0 | 1 | 0 | 1 | 1 | 0 | 1 | 1 | 0 | 1 | 0 | 1 | 1 | 0 | 1 | 0 | 0 | 0 | 0 | 0 | 1 | 1 | 1 | 1 | 0 |
| CB5 | 1 | 0 | 0 | 1 | 0 | 0 | 0 | 0 | 0 | 1 | 0 | 0 | 0 | 0 | 1 | 0 | 0 | 1 | 0 | 1 | 0 | 1 | 1 | 0 | 0 | 1 | 0 | 1 | 1 |
| CB6 | 0 | 1 | 0 | 1 | 1 | 1 | 1 | 0 | 0 | 0 | 1 | 1 | 1 | 1 | 0 | 1 | 1 | 1 | 0 | 0 | 0 | 0 | 0 | 0 | 0 | 0 | 0 | 1 | 1 |
| CB7 | 1 | 0 | 1 | 0 | 1 | 1 | 1 | 0 | 1 | 0 | 0 | 0 | 0 | 0 | 1 | 0 | 1 | 1 | 0 | 0 | 1 | 0 | 0 | 0 | 0 | 0 | 1 | 1 | 1 |

FIG. 4

| bit | 29 | 30 | 31 | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 |
|---|---|---|---|---|---|---|---|---|---|---|---|---|---|---|---|---|---|---|---|---|---|---|---|---|---|---|---|---|---|
| CB0 | 0 | 0 | 0 | 0 | 0 | 0 | 0 | 0 | 0 | 1 | 0 | 0 | 0 | 0 | 0 | 0 | 0 | 0 | 0 | 1 | 0 | 0 | 0 | 0 | 0 | 0 | 0 | 0 | 1 |
| CB1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 1 |
| CB2 | 0 | 0 | 0 | 0 | 0 | 0 | 0 | 0 | 0 | 0 | 1 | 0 | 0 | 1 | 1 | 0 | 1 | 1 | 0 | 1 | 1 | 1 | 0 | 0 | 0 | 0 | 0 | 0 | 0 |
| CB3 | 1 | 1 | 0 | 0 | 0 | 0 | 0 | 0 | 0 | 0 | 1 | 0 | 0 | 1 | 0 | 0 | 0 | 0 | 0 | 1 | 0 | 1 | 0 | 0 | 0 | 0 | 0 | 0 | 1 |
| CB4 | 0 | 0 | 1 | 0 | 1 | 1 | 0 | 0 | 0 | 1 | 0 | 0 | 0 | 0 | 1 | 1 | 1 | 0 | 0 | 0 | 0 | 1 | 0 | 0 | 0 | 0 | 1 | 1 | 1 |
| CB5 | 1 | 1 | 1 | 1 | 1 | 0 | 1 | 0 | 0 | 1 | 1 | 0 | 1 | 0 | 1 | 0 | 0 | 1 | 1 | 1 | 0 | 0 | 0 | 0 | 1 | 1 | 1 | 1 | 1 |
| CB6 | 0 | 1 | 0 | 1 | 1 | 1 | 1 | 1 | 1 | 0 | 0 | 0 | 0 | 0 | 0 | 0 | 0 | 1 | 0 | 1 | 1 | 0 | 0 | 0 | 0 | 1 | 1 | 0 | 1 |
| CB7 | 0 | 0 | 0 | 1 | 1 | 1 | 0 | 1 | 1 | 0 | 1 | 0 | 0 | 1 | 0 | 0 | 1 | 0 | 1 | 1 | 1 | 0 | 0 | 1 | 0 | 1 | 0 | 1 | 0 |

| bit | 93 | 94 | 95 | 96 | 97 | 98 | 99 | 100 | 101 | 102 | 103 | 104 | 105 | 106 | 107 | 108 | 109 | 110 | 111 | 112 | 113 | 114 | 115 | 116 | 117 | 118 | 119 | 120 | 121 |
|---|---|---|---|---|---|---|---|---|---|---|---|---|---|---|---|---|---|---|---|---|---|---|---|---|---|---|---|---|---|
| CB0 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 |
| CB1 | 0 | 0 | 0 | 0 | 0 | 0 | 1 | 1 | 1 | 1 | 1 | 1 | 1 | 1 | 1 | 1 | 1 | 1 | 1 | 1 | 1 | 0 | 0 | 0 | 0 | 0 | 0 | 1 | 1 |
| CB2 | 0 | 0 | 0 | 0 | 0 | 1 | 1 | 1 | 1 | 0 | 0 | 0 | 0 | 1 | 0 | 0 | 0 | 0 | 0 | 0 | 0 | 1 | 1 | 1 | 1 | 1 | 0 | 0 | 0 |
| CB3 | 1 | 1 | 1 | 1 | 0 | 1 | 1 | 1 | 0 | 0 | 1 | 0 | 0 | 1 | 1 | 0 | 1 | 1 | 1 | 1 | 0 | 1 | 1 | 0 | 0 | 0 | 1 | 1 | 1 |
| CB4 | 1 | 1 | 0 | 0 | 1 | 1 | 1 | 1 | 0 | 1 | 0 | 1 | 0 | 1 | 0 | 1 | 1 | 0 | 0 | 0 | 1 | 1 | 1 | 1 | 1 | 1 | 1 | 1 | 1 |
| CB5 | 1 | 0 | 1 | 1 | 1 | 0 | 1 | 0 | 0 | 0 | 0 | 0 | 1 | 1 | 1 | 1 | 1 | 1 | 1 | 1 | 1 | 1 | 0 | 0 | 0 | 1 | 1 | 1 | 1 |
| CB6 | 1 | 0 | 1 | 1 | 1 | 0 | 0 | 0 | 1 | 0 | 1 | 1 | 1 | 0 | 1 | 0 | 0 | 1 | 0 | 1 | 1 | 1 | 1 | 1 | 1 | 1 | 1 | 0 | 0 |
| CB7 | 0 | 1 | 1 | 1 | 1 | 1 | 0 | 0 | 1 | 0 | 1 | 1 | 1 | 1 | 1 | 1 | 0 | 1 | 1 | 1 | 1 | 0 | 1 | 1 | 1 | 1 | 1 | 0 | 1 |

FIG. 4 (CONT.)

| bit | 58 | 59 | 60 | 61 | 62 | 63 |
|-----|----|----|----|----|----|----|
| CB0 | 0  | 0  | 1  | 1  | 1  | 1  |
| CB1 | 0  | 0  | 1  | 1  | 1  | 1  |
| CB2 | 0  | 0  | 1  | 1  | 1  | 1  |
| CB3 | 0  | 0  | 1  | 1  | 1  | 1  |
| CB4 | 1  | 0  | 1  | 0  | 0  | 0  |
| CB5 | 0  | 1  | 0  | 1  | 0  | 0  |
| CB6 | 1  | 1  | 0  | 0  | 1  | 0  |
| CB7 | 1  | 1  | 0  | 0  | 0  | 1  |

| bit | 122 | 123 | 124 | 125 | 126 | 127 | CB1 | CB2 | CB3 | CB4 | CB5 | CB6 |
|-----|-----|-----|-----|-----|-----|-----|-----|-----|-----|-----|-----|-----|
| CB0 | 1   | 1   | 1   | 1   | 1   | 0   | 1   | 0   | 0   | 0   | 0   | 0   |
| CB1 | 1   | 1   | 1   | 1   | 0   | 1   | 0   | 1   | 0   | 0   | 0   | 0   |
| CB2 | 1   | 1   | 1   | 0   | 1   | 1   | 0   | 0   | 1   | 0   | 0   | 0   |
| CB3 | 1   | 1   | 0   | 1   | 1   | 1   | 0   | 0   | 0   | 1   | 0   | 0   |
| CB4 | 1   | 0   | 1   | 1   | 1   | 1   | 0   | 0   | 0   | 0   | 1   | 0   |
| CB5 | 0   | 1   | 1   | 1   | 1   | 1   | 0   | 0   | 0   | 0   | 0   | 1   |
| CB6 | 1   | 1   | 1   | 1   | 1   | 1   | 0   | 0   | 0   | 0   | 0   | 0   |
| CB7 | 1   | 1   | 1   | 1   | 1   | 1   | 0   | 0   | 0   | 0   | 0   | 0   |

MEMORY CONTROLLER ERROR CHECKING PROCESS USING INTERNAL MEMORY DEVICE CODES

FIELD OF INVENTION

The field of invention pertains generally to the computing sciences, and, more specifically, to a memory controller error checking process using internal memory device codes.

BACKGROUND

A pertinent issue in many computer systems is the system memory (also referred to as "main memory"). Here, as is understood in the art, a computing system operates by executing program code stored in system memory and reading/writing data that the program code operates on from/to system memory. As such, system memory is heavily utilized with many program code and data reads as well as many data writes over the course of the computing system's operation. Finding ways to improve system memory accessing performance is therefore a motivation of computing system engineers.

FIGURES

A better understanding of the present invention can be obtained from the following detailed description in conjunction with the following drawings, in which.

DETAILED DESCRIPTION

As is known in the art, dual in line memory modules (DIMMs) are used to implement system memory (also referred to as main memory) in various kinds of computing systems (e.g., servers, personal computer towers, etc.). In a typical scenario, one or more DIMMs respectively plug into one or more memory channel connectors that are disposed on a motherboard.

Figure 1:
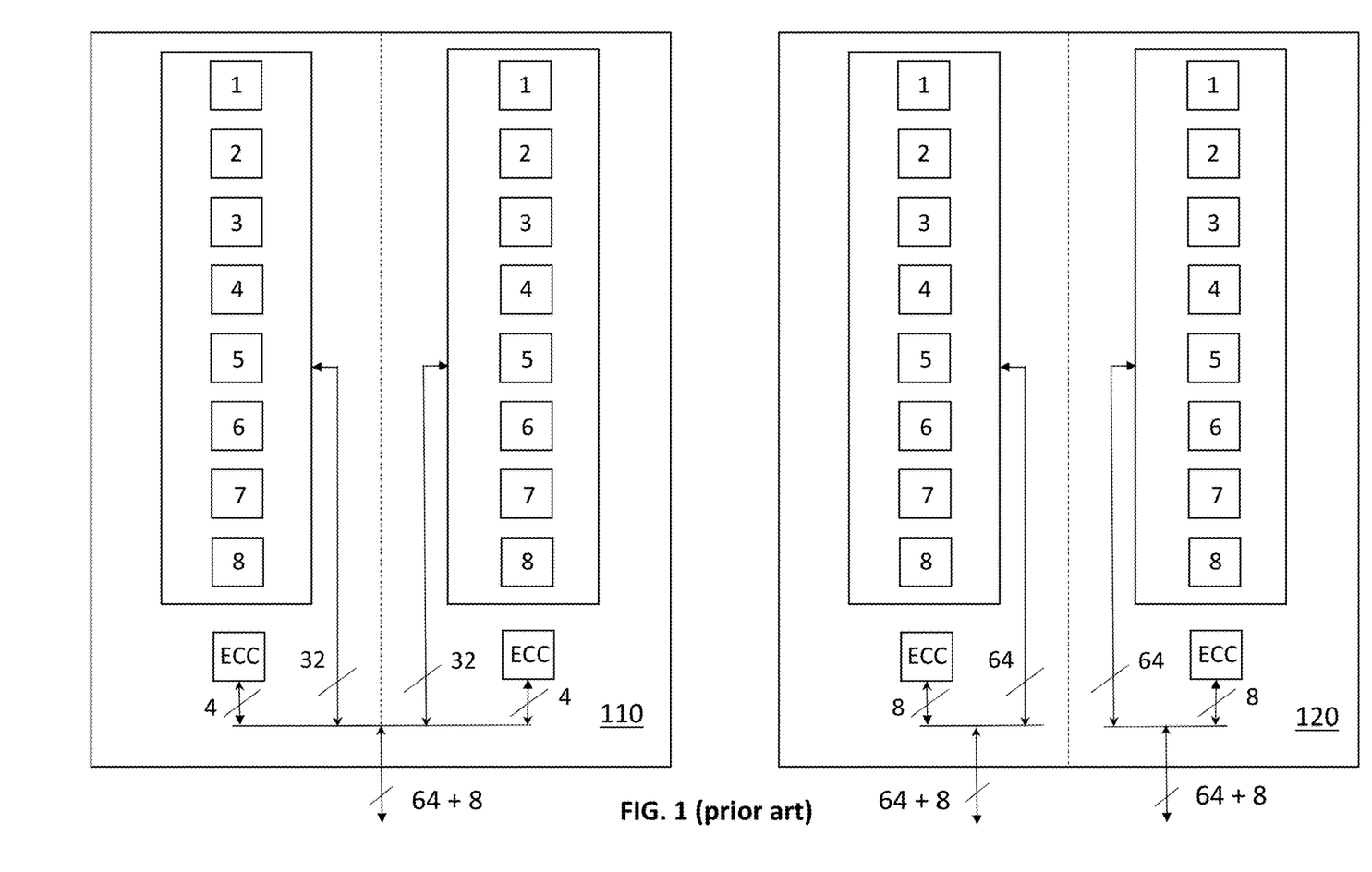
FIG. 1 shows an ×4 DIMM and an ×8 DIMM

FIG. 1 shows two different types of prior art DIMMs. A first DIMM 110 is referred to as an "×4 DIMM". A second DIMM 120 is referred to as "×8 DIMM". As observed in FIG. 1, each type of DIMM 110, 120 includes eight memory chips 1 through 8 on each DIMM side. "×4" indicates there are four bits per memory device and "×8" indicates there are eight bits per memory device. As such, the ×4 DIMM 110 has a 32 bit data bus on each side of the DIMM 110 and the ×8 DIMM has 64 bit data bus on each side of the DIMM 120 (different DIMM sides are separated by a dotted line that runs through the middle of each DIMM 110, 120 depicted in FIG. 1).

Here, the memory channel that the DIMM cards 110, 120 are to plug into has a 64 bit data bus. The memory channel is typically designed to have a number of separately addressable ranks of memory that can plug-into the memory channel. As such, the entire ×4 DIMM 110 behaves as a single 64 bit rank. By contrast, each side of the ×8 DIMM 102 behaves as a 64 bit rank.

Both DIMMs 110, 120 also include on board ECC chips. Here, in various implementations, the 64 bit data bus of the memory channel also reserves 8 bits for error correction coding (ECC) information. As is known in the art, a memory controller writes a 64 bit data word into a specific address of each of the memory chips 1 through 8. That is, in the case of the ×4 DIMM, the memory controller writes 4 unique bits into each of sixteen memory chips (eight chips on both DIMM sides), whereas, in the case of the ×8 DIMM, the memory controller writes 8 unique bits into each of eight memory chips (one set of eight memory chips on a particular side of the DIMM).

In a typical system memory or main memory application, units of data are accessed from system memory as a cache line composed of multiple 64 bit words. For example, in a computing system that is designed to access 512 bit cache lines, a cache line is read from or written to particular DIMM with eight read/write bursts from/to the DIMM where each burst cycle involves a 64 bit data word and 8 bits of ECC. As such, each cache line corresponds to 512 bits of data (64×8=512) and 64 bytes of ECC (8×8=64). Here, during a cache line write process, the memory controller calculates a 64 bit ECC value from the 512 bits of write data and stores 8 bit slices of the ECC into the DIMM with each burst cycle.

Here, the ECC information can be seen as a special code whose value is a function of the particular bit pattern of the 512 bit cache line data. During any burst cycle of a cache line write, 8 bits of ECC information is stored in ECC memory on the DIMM along with a 64 bit data word during the write process at the same memory address as the 64 bit data word. Thus, a complete write operation to a DIMM for a single burst cycle, includes not only the writing of a 64 bit data word onto the DIMM, but also, the writing of 8 bits of ECC information for the word onto the DIMM. In various implementations, the physical addresses that are applied to the system memory reserve three lower ordered bits for the individual bursts per cache line and higher ordered bits specify the cache line's system memory address.

Should the memory controller receive a subsequent read request for a previously written cache line, the memory controller will issue burst read requests for the cache line to the DIMM which results in the DIMM card supplying, for each burst cycle, not only the 64 bit data word but also the 8 bit slice of ECC information that was stored along with the data word. Upon receipt of the 512 but cache line (after eight burst cycles), the memory controller recalculates the ECC information from the 512 bit cache line and compares it to the 64 bits of ECC information that was accumulated from the eight read bursts that were read from the DIMM. If the newly calculated ECC information matches the 64 bits of ECC information that was read from the DIMM the cache line that was read from the DIMM is deemed to be error free and is forwarded to whichever unit of the computing system requested the word (e.g., a CPU core, a GPU, a network interface, etc.).

If the newly calculated ECC information does not match the ECC information that was read from the DIMM, the memory controller will recognize that some kind of corruption exists in the cache line or the ECC information that was read from the DIMM. However, the 512 bit cache line and the 64 bits of ECC information can be processed to "recover" the lost information such that a correct 512 bit cache line and corresponding, correct ECC information can be rebuilt by the memory controller. Thus, even though a corruption existed in the information that was read from the DIMM, the corruption can be fully recovered from and the correct 512 bit cache line can be forwarded to whichever unit of the computing system requested it.

With respect to the aforementioned bursts, in the case of a double data rate (DDR) memory channel, such as a DDR memory channel having characteristics defined by a Joint Electron Device Engineering Council specification (e.g., DDR4), there are two such read/write cycles per clock cycle (one read/write cycle on the rising edge of the clock and one read/write cycle on the falling edge of the clock). As described at length above, to effect a 512 bit cache line, prior art ×4 DIMMs execute 512 bit bursts over eight cycles (16 memory devices×4 bits per memory device×8 cycles per burst=512 bits per burst). By contrast, to effect a 512 bit cache line, prior art ×8 DIMMs execute 512 bit bursts over eight cycles (8 memory devices×8 bits per memory device×8 cycles per burst=512 bits per burst).

JEDEC is an industry standard group that promulgates engineering specifications for memory channels and the devices that connect to them such as DIMMs and memory controllers (recent JEDEC memory channels have been commonly referred to as "DDR" memory channels because they are designed to clock data on both the rising and falling edges of a clock signal as described above).

Figure 2:
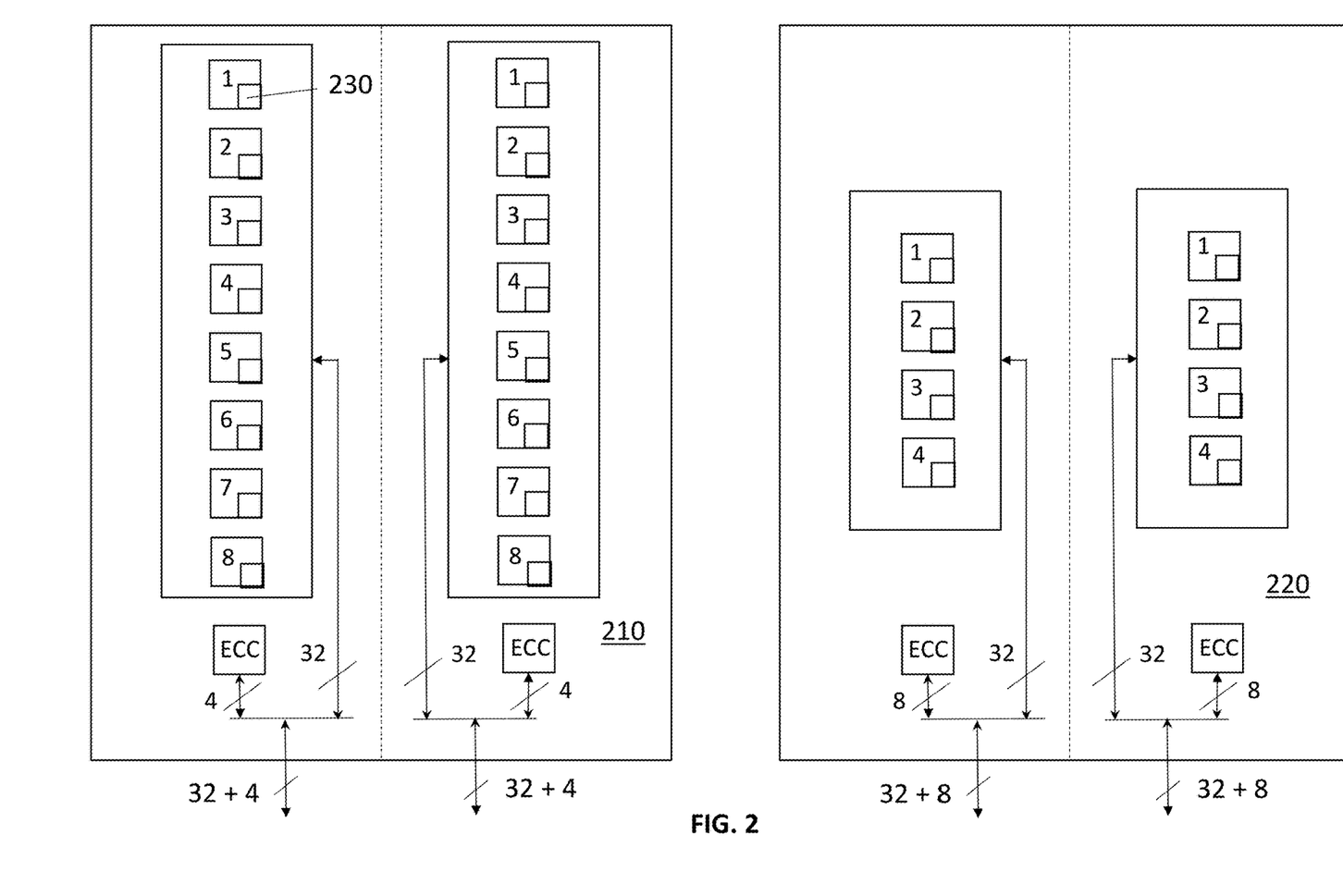
FIG. 2 shows another set of ×4 and ×8 DIMMs.

The prior art DIMM cards 110, 120 of FIG. 1 indicate that two ECC memory devices are disposed on the DIMM cards 110, 120. Future JEDEC DDR memory channels, however, aim to change the manner in which DIMM cards are accessed. In particular, future JEDEC DDR memory channels will emphasize longer bursts of fewer bit widths. FIG. 2 shows a logical perspective of the newer ×4 and ×8 DIMMs 210, 220. As can be seen in FIG. 2, both the ×4 DIMM 210 and the ×8 DIMM 220 can be viewed as supporting 32 bit transfers rather than 64 bit transfers (the bit width is logically reduced by half). However, although the bit width is logically reduced by half, the number of cycles per burst is increased from eight cycles to sixteen cycles. As such, a 512 bit cache line for the new ×4 DIMM 210 is realized as 8 memory devices×4 bits per memory device×16 cycles per burst. For the new ×8 DIMM 220, a 512 bit cache line is realized as 4 memory devices×8 bits per memory device×16 cycles per burst.

The change in logical perspective of the DIMMs includes a corresponding change in ECC information from 8 bits per transfer to 4 bits per transfer for an ×4 DIMM. That is, per transfer of an ×4 DIMM the ECC information, like the bit width, has been cut in half. The reduction in ECC bit width corresponds to less protection from the ECC information that is stored on the ×4 DIMM's on board ECC memory devices. Moreover, even though a new ×8 DIMM can store 8 bits of ECC information per burst, in various embodiments, the ×8 DIMM will use the ×4 DIMM ECC code which results in correspondingly less error protection coverage. Error coverage is less in both new and old DDR technologies for ×8 DIMMs as compared to an ×4 DIMM, because twice as much data needs to be corrected when a ×8 DIMM fails than when a ×4 DIMM fails.

Nevertheless, the relaxation of the on board memory ECC information is believed to permit acceptable performance because each memory chip on the newer DIMMs will include their own internal ECC function 230 (for ease of drawing FIG. 2 only expressly labels one internal memory ECC function 230).

As such, the memory chips themselves will be able to recover corrupted data that was read from their own internal memory arrays so that correct data is presented by the memory chips even though their own internal memory arrays presented corrupted data. With the prior art DIMMs 110, 120 of FIG. 1, data corruptions that originated from the memory chip arrays could only be corrected by the memory controller with the ECC information that was stored in the DIMM's on board ECC memory chips.

However, in various embodiments, the ECC function 230 that is integrated on the memory die is a single error correction (SEC) code that is not capable of recovering from multi-bit errors. For example, in an implementation, the storage cell array of each memory chip is divided into regions of, e.g., 128 bits and a unique internal SEC code is maintained by a memory chip for each different 128 bit region. Here, each SEC code can recover from a single bit error in a 128 bit region but cannot recover from an error in two or more bits in a 128 bit region (during a nominal write process into the memory chip, the memory chip internally calculates a new SEC value for the particular 128 bit region that the write data is being written into).

The newer DIMM cards 210, 220 therefore present an error recovery challenge if a single memory device generates more than one error during a memory read. Here, the memory device will not be able to correct the multibit error (because it uses an SEC code) and the on board ECC memory device protection may not be capable of correcting the error because of its reduced information content.

As such, in the case of a multibit error from a single memory device that the memory device itself cannot correct, the memory controller's processing of the read data and the on board ECC information will be able to detect that an error exists but will not be able to identify where the error is. That is, in the case of a multibit error from a particular memory device that is not corrected for by the memory device, the limited ECC information from the DIMM's on board ECC memory device is able to identify that an error has occurred but is not able to identify which memory device has generated the multibit error.

Figure 3A:
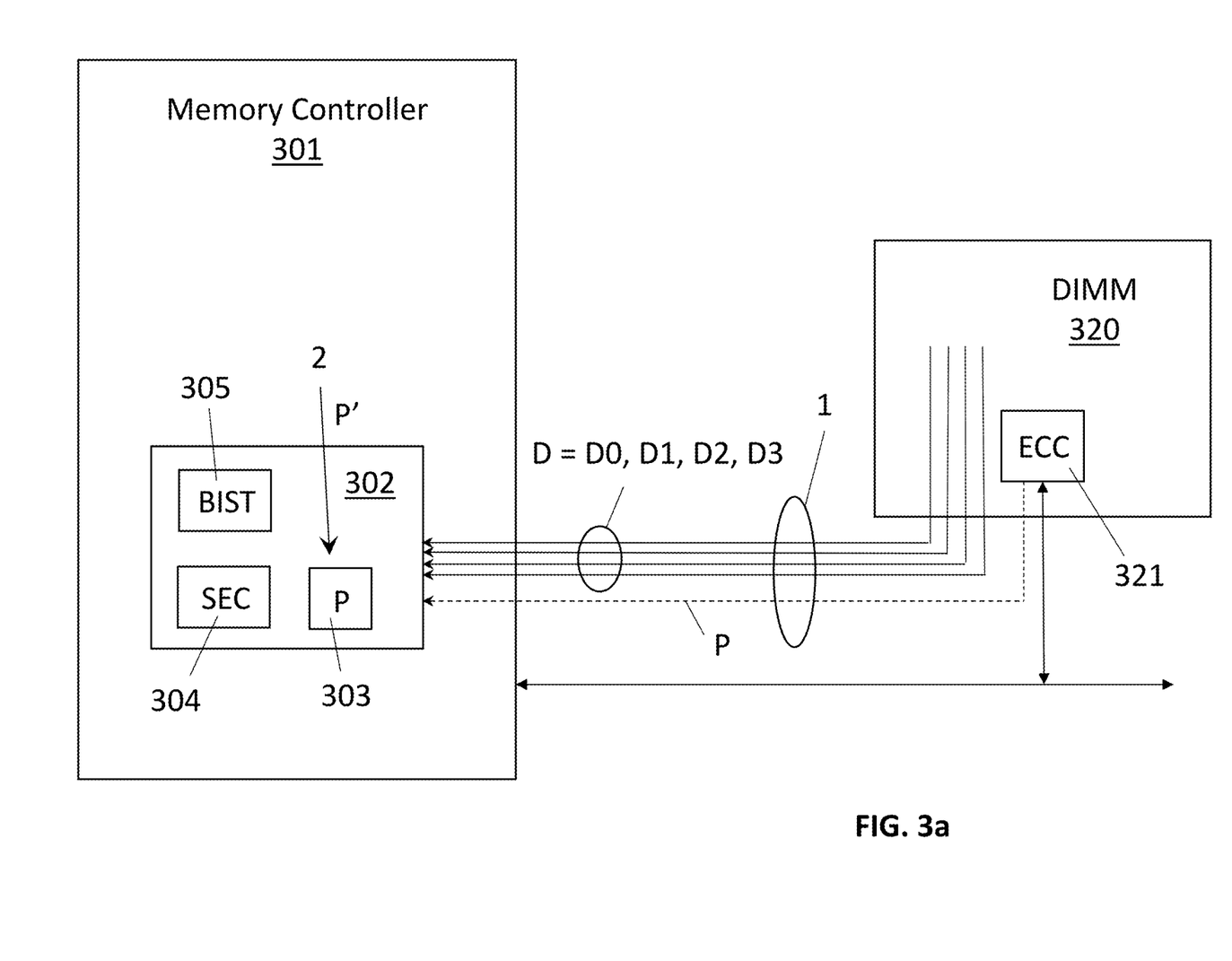
FIGS. 3a, 3b and 3c pertain to an error checking process.
Figure 3B:
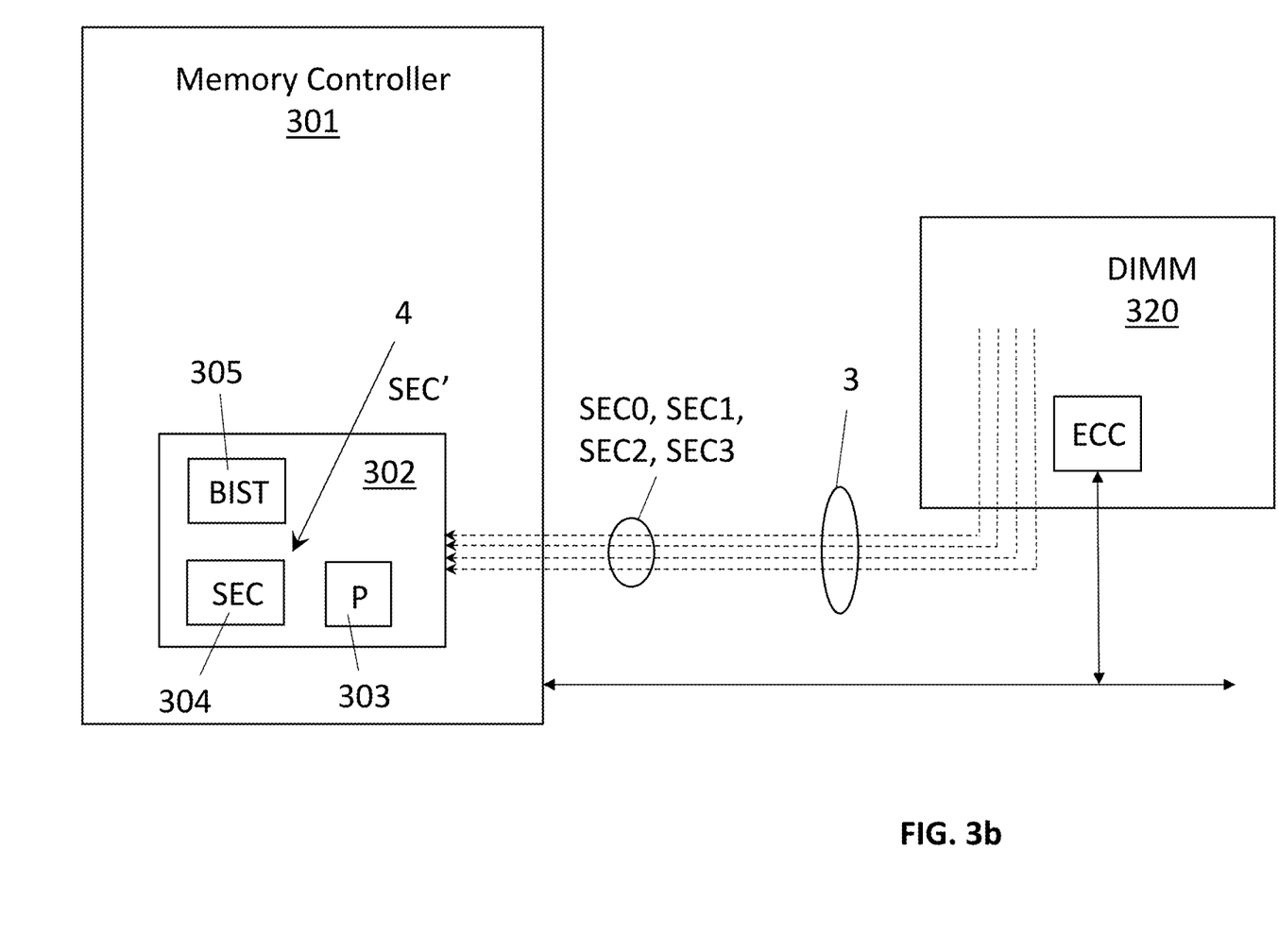
Figure 3C:
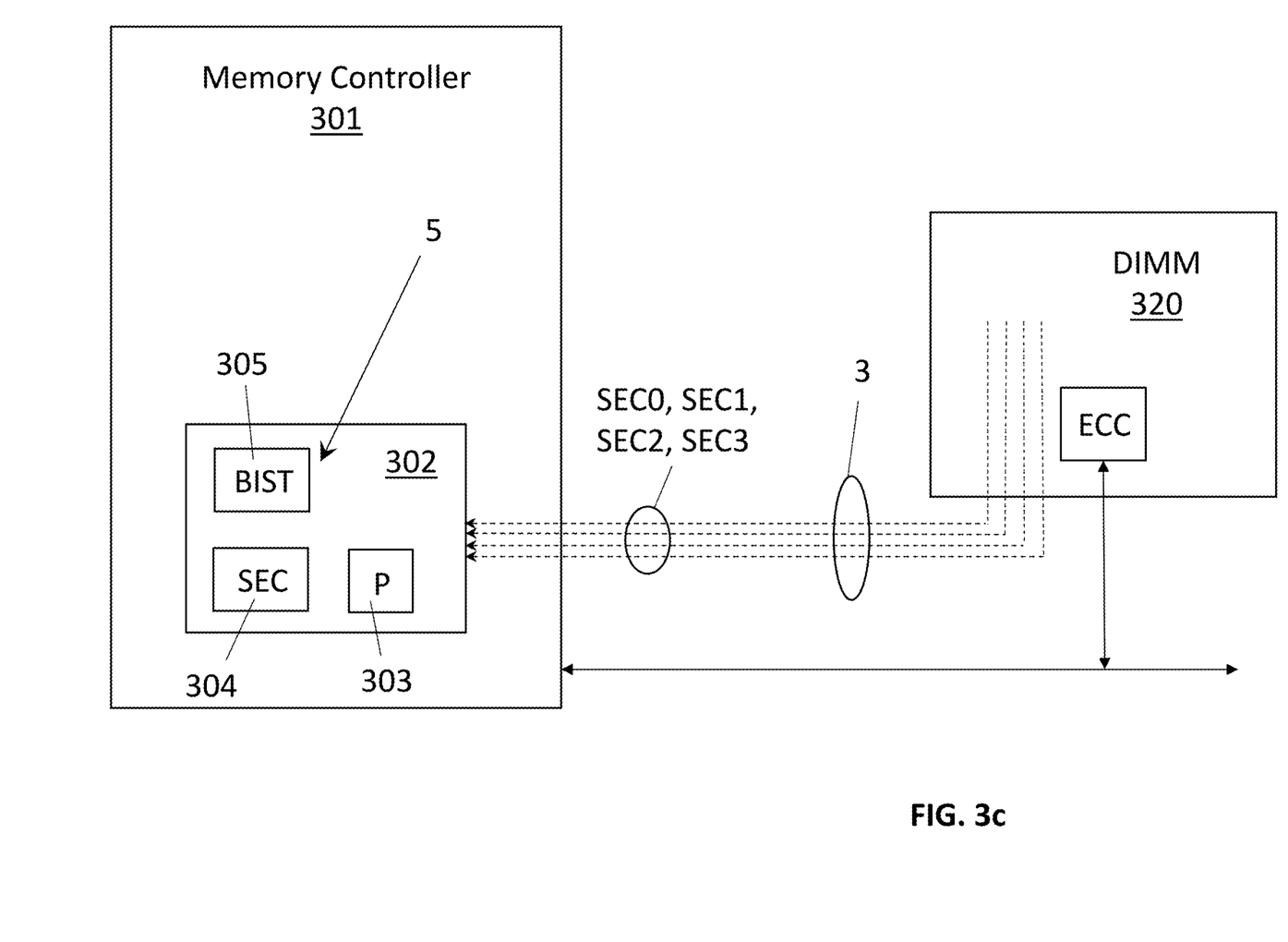

FIGS. 3a, 3b and 3c pertain to a read error recovery process that can be performed by a memory controller 301 with the error correction information that resides on the DIMM 320 to not only identify which memory device on the DIMM 320 has generated the multibit error but also recover the lost data (replace the corrupted data with correct data). For ease of discussion the following example will pertain to a ×8 DIMM 220, 320 which has four memory devices per burst transfer of read data (not counting ECC).

Before the read operation, referring to FIG. 3a it is assumed that the memory controller 301 includes ECC generation logic circuitry to generate an ECC code P that is written into the DIMM's on board ECC memory 321 for each memory word stored on the DIMM 320. Here, in the case of an ×8 DIMM 320, each memory word consists of four eight bit data components $D_0$, $D_1$, $D_2$, and $D_3$ (one eight bit data component per memory chip). In an embodiment, the ECC code that is generated by the memory controller 301, P, can be expressed as:

$$P = S_0(D_0) + S_1(D_1) + S_2(D_3) + S_4(D_4) \qquad \text{Eqn. 1}$$

where: 1) $D_x$ is a first, second, third or fourth component of the cache line D being written where D1 corresponds to the information written into a first memory device over the bursts needed to fully write the cache line, D2 corresponds to the information written into a second memory device over the bursts needed to fully write the cache line, D3 corresponds to the information written into a third memory device over the bursts needed to fully write the cache line, and D4 corresponds to the information written into a fourth memory device over the bursts needed to fully write the cache line; 2) $S_x(D_x)$ is a unique scramble (e.g., shift amount) applied to $D_x$ that is a function of x; and, 3) the operation "+" corresponds to a bitwise XOR. Here, it should be apparent that x can be any of 0, 1, 2 or 3 for an ×8 DIMM that employs four memory devices per transfer (the value of x represents a specific one of the four memory devices).

As observed in FIG. 3a, the read 1 of the DIMM card 320 is performed in multiple bursts to effect complete transfer of a cache line as usual with, for each burst cycle, the data word from each memory device being read concurrently with the slice of ECC code P that was appended to that data word by the memory controller. In the case of an ×8 DIMM 320 that employs four memory devices per transfer, the read cache line is D=D0, D1, D2, D3 where D0 is the information read over the multiple bursts from a first memory device on the DIMM 320, D1 is the information read over the multiple bursts from a second memory device on the DIMM 320, D2 is the information read over the multiple bursts from a third memory device on the DIMM 320 and D3 is the information read over the multiple bursts from a fourth memory device on the DIMM 320. Additionally, the ECC code, P, for cache line D is read, over the multiple bursts, from the ECC memory device 321 on the DIMM 320. (128b from each ×8 device in DDR5)

After the data word D and its code P are read 1 from the DIMM 320, the memory controller's error checking logic circuitry 302 recalculates 2 an ECC code word P' from the cache line D that was just read from the DIMM and compares it to the ECC code word P that was just read from the DIMM. Here, first logic circuitry 303 of the error checking logic circuitry 302 is designed to, e.g., execute the formulation of Eqn. 1 above. If P'=P there is no data corruption and the cache line D is forwarded to the requestor of the data. If, however, P'≠P there is a data corruption that needs to be resolved by the error checking logic circuitry 302. Here, again, it is assumed that the detected error is a multi-bit error from one of the memory devices on the DIMM 320 (because the memory devices would have been able to correct any single bit errors internally).

In an embodiment, the ECC code P/P' is not capable by itself of determining which memory device generated the corruption. That is, it cannot be determined just from analysis of P and P' which of D0, D1, D2 or D3 contains the multi-bit error.

As such, referring to FIG. 3b, the SEC code that was generated by each memory device's internal SEC function is read 3 from each memory device on the DIMM 320 by the memory controller. Recall from above that in an embodiment each memory device stores an SEC code for each 128 bit data region of a memory device's internal storage cell array. In the case of an ×8 DIMM, in an embodiment, each SEC code is 8 bits. Upon a read of data from any memory device, the memory device internally recalculates the SEC code for the targeted read data from the 128 region that the targeted read data is a component of. The memory device compares the recalculated SEC code for the 128 bit region with the stored SEC code for the 128 bit region. If the codes match the memory device will conclude there is no error and will not attempt any correction (it will simply forward the read data).

Thus, to reiterate, if after the initial read 1 and P based ECC check 2 of FIG. 3a the memory controller 301 determines that one of the memory devices must have generated a multi-bit error (PSP), referring to FIG. 3b, a next phase of the recovery process entails reading 3 the SEC codes SEC0, SEC1, SEC2 and SEC3 that were stored within the memory devices for each of the respective 128 bit regions that the D0, D1, D2 and D3 correspond to within their respective memory devices on the DIMM 320 (each 128 bit region on a memory chip that an SEC value was calculated for was calculated over the 16 bursts of 8 bits of write data that was written into the memory device for the cache line).

Here, in various embodiments, perhaps as many as half of the multi-bit errors that are generated by a memory device are not correctable with the memory device's internal SEC code, but, such errors are nevertheless detectable with the memory device's internal SEC code (all multi-bit errors are not correctable by the memory device ECC when that ECC is an SEC code, but approximately half are detectable, the others are miss-corrections). That is, the memory device's internal SEC function can detect there is an error with the SEC code but cannot correct the error. Here, if "SEC" is the original stored SEC code for a 128 bit region and the recalculated code for the read operation from the 128 bit region is "SEC'", the memory device will at least be able to detect that SEC≠SEC'.

As such, in an embodiment, with the read 3 of the originally stored SEC0, SEC1, SEC2 and SEC3 codes, the memory controller 301 (having logic circuitry 304 to execute the memory device's internal SEC function too) can recalculate 4 SEC0', SEC1', SEC2' and SEC3' from the received data segments D0, D1, D2 and D3 (SEC0' can be calculated by applying the SEC function to D0, SEC1' can be calculated by applying the SEC function to D1, etc.). Here, in a scenario where only one of the memory devices has generated a multibit error, only one of the SEC code pairs will not match. For example, if SEC0≠SEC0' then the memory controller's error checking logic circuitry 302 will recognize that memory device 0 has generated the multibit error, if SEC1≠SEC1' then the memory controller's error checking logic circuitry 302 will recognize that memory device 1 has generated the multibit error, etc.

When the memory device that is in error is known, the corrupted data can be recovered using P and reverse application of the custom scramble that was applied to the failed memory device's data. That is, if memory device 0 generated the error, then, $$P'=S_0(D_0+e)+S_1(D_1)+S_2(D_3)+S_4(D_4) \qquad \text{Eqn. 2}$$

where $D_0$ is the correct data for memory device 0 and e is a corruption value that when bitwise XORed with the correct data $D_0$ results in the corrupted data component that was received for memory device 0. Said another way, if the corrupted data that was received from memory device 0 is $D_0^C$, then, $D_0^C=D_0$ XOR e. With the scrambling function $S_0$ being distributive, Eqn. 2 can be re-expressed as $$P'=S_0(D_0)+S_0(e)+S_1(D_1)+S_2(D_3)+S_4(D_4). \qquad \text{Eqn. 3}$$

Taking the difference of P (the value read from the ECC memory on the DIMM 320) and the value of P' (the ECC value that was recalculated by circuitry 303 during process 2 of FIG. 3a) yields:

$$P'-P=S_0(e). \qquad \text{Eqn. 4}$$

That is, taking the difference of P' and P yields the corruption value e scrambled according to the custom scramble that is reserved for memory device 0. Applying the reverse of the custom scramble to the difference of P' and P therefore yields e (that is, $S_0^{-1}(P'-P)=e$). From e, $D_0$ can be recovered by performing an XOR on $D_0^C$ and e. That is, $D_0=D_0^C$ XOR e (the inverse of an XOR is an XOR).

The reader should understand that the use of memory device 0 as the memory device that generated the corrupted data is just an example and that the same process can be used for any of the other memory devices if any of the other memory devices was deemed to be the memory device that provided the corrupted result. The only difference amongst the different memory devices in the recovery process is the custom reverse scramble that is reserved for each memory device. The above mentioned approach can also correct single bit errors that arose for reasons other than an internal memory device error (e.g., a bit flip on the physical memory channel).

It is also pertinent to point out that, e.g., as a form of error correction speed up, if a memory device detects an internal error that it cannot correct, some form of meta data may be set in the initial read 1 of FIG. 3a to inform the memory controller 301 that an uncorrectable error has been detected by the memory device (e.g., a special message may be issued on the memory channel's CA bus). With the memory controller 301 recognizing that a memory device that it has just read from has detected an error that it cannot correct, the memory controller 301 can immediately issue the read 3 of SEC information without having to wait for the error checking logic circuitry 302 to determine that P'≠P.

The preceding example described a process in which the memory device in error (memory device 0 in the example) can be identified by the memory controller 301 re-executing 4 the internal memory's SEC algorithm on the data it received from each memory device and comparing it to the internal SEC code information that each memory device generated for its respective data with its internal SEC function. As stated above, in approximately half of multibit error circumstances, the two codes (SEC and SEC') will be different which leads to straightforward identification of the memory device in error.

The other "half" of the multibit error circumstances, however, result in the two SEC codes SEC' and SEC matching (at the memory controller 301 and in the memory device). That is, even though there is a multibit error in the read data of a memory device, the SEC code is the same for both the correct data and the corrupted data (which is part of the limitation of an SEC code which is geared towards resolving only a single bit error). However, the SEC code generation algorithm (H) and the data that was returned by the memory devices can still be processed to isolate which one of the memory devices contains the multibit error.

Here, as is known in the art, the generation of an error correction code, such as the memory devices' internal SEC code, involves the bitwise multiplication of the data to be encoded (e.g., the data of a 128 bit region within the memory) with the binary values of a matrix H having a 1 or a 0 in each intersection of a row or column of the matrix.

Here, for example, the bit pattern of each row of the matrix H indicates the presence (1) or lack of presence (0) of a coefficient of a parity check equation (as such, each row represents a different parity check equation in the encoding process), where, there is a unique parity check equation for each bit in the special code that is to be generated for the data. Thus, if an eight bit code is to be generated for the data, the H matrix has eight rows. Additionally, in common H matrix structures, the matrix H has a number of columns that is equal to the number of bits of the data being encoded and the number of bits of the code that is to be generated by the encoder for the data.

Thus, for example, if an SEC code is to generate an eight bit SEC code for 128 bits of data, the H matrix has eight rows (one for each parity check equation or bit in the generated SEC code) and 134 columns (128 columns for each bit of the data being encoded and 8 bits for each bit of the SEC code to be generated for the data). After mathematically applying the matrix H to the data being encoded (e.g., in a matrix multiply operation), the eight bit SEC code is generated. An example of such an H matrix is provided in FIG. 4.

Figure 4:
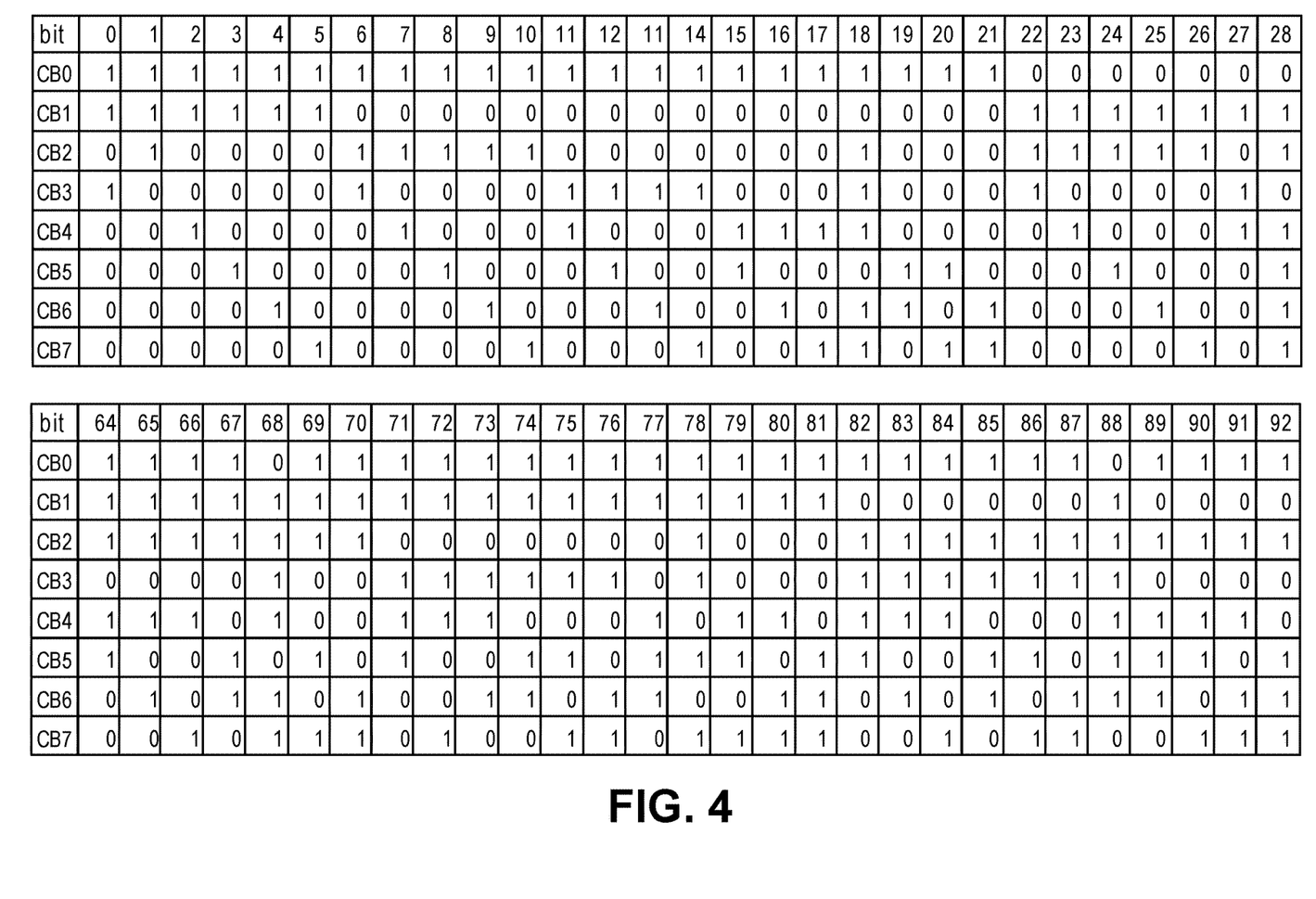
FIG. 4 shows an SEC code.

In the case where an SEC code can not even identify the existence of multibit errors because the SEC code read from a memory device's storage array matches the corresponding SEC code generated by the memory controller, for the SEC matrix H of FIG. 4, if the memory device in error generated only two bit or three bit errors, the memory controller can still recover the lost data by performing the operation:

$$H' \times (S_m^{-1}(S_n(e))), n, m \in [0,1,2, \ldots (d-1)] \qquad \text{Eqn. 5}$$

where: 1) H' is the aforementioned SEC matrix H but with the (e.g., eight) columns for the SEC code bits removed; 2) e is the error term that when XORed with the correct data for the memory device that generated the error produces the corrupted data that was received for that memory device; 3) is the inverse custom scramble for memory device m; 4) is the custom scramble for memory device n; and, 4) d is the number of memory devices. Performing the operation of Eqn. 5 will yield a minima (e.g., 0) in the location of the resultant array where m=n=memory device in error (the location of the minima identifies the memory device in error).

When the memory device in error is known, the corrupted data that was received for that memory device can be corrected by applying the same approach described above with respect to Eqn. 4. Thus, multibit errors from a single memory device can be recovered even if the SEC codes generated by the read data and the SEC codes that were stored with the read data do not match one another.

In the case of even more errors, such as more than three errors from a same memory device that uses the SEC code of FIG. 4, or errors from more than one memory device, in various embodiments, such errors would be more reflective of a serious hardware problem rather than nominal DRAM bit flips and occasional/expected soft errors within the system.

As such, referring to FIG. 3c, the memory controller's error checking circuitry 302 further includes built-in-self-test (BIST) logic circuitry 305. Here, the memory controller 301 enters a BIST mode if P'≠P for the data word D, SEC'=SEC for all memory devices and execution of the recovery process described above with respect to Eqn. 5 did not yield the desired minima in any location in the resultant array. In the case of BIST mode entry, the memory controller 301 writes known data patterns into the memory devices of the DIMM 320 and then reads them back from the DIMM 320.

Here, in the case of a serious hardware failure of any one or more memory devices (or the larger memory channel/system), the results of the BIST operation should reveal which memory device(s) are not operating reliably.

Although the examples above relied primarily upon the use of an ×8 DIMM, the reader should understand that the teachings of these examples can be readily applied to ×4 DIMMs or other DIMMs composed of memory devices having a bit width other than four bits or eight bits. Additionally, although the examples above discussed a single data word D, as described above, the single data word D may be one of many (e.g., 16

In the above descriptions of any of the memory controller 301, error checking circuitry 302 or components thereof may be implemented with logic circuitry disposed on a semiconductor chip. Logic circuitry may include dedicated custom hardwired logic circuitry, programmable logic circuitry (e.g., field programmable gate array (FPGA) logic circuitry, programmable logic array (PLA) logic circuitry, etc.) or logic circuitry that executes program code (e.g., embedded processor logic circuitry, embedded controller logic circuitry) or any combination thereof.

Figure 5:
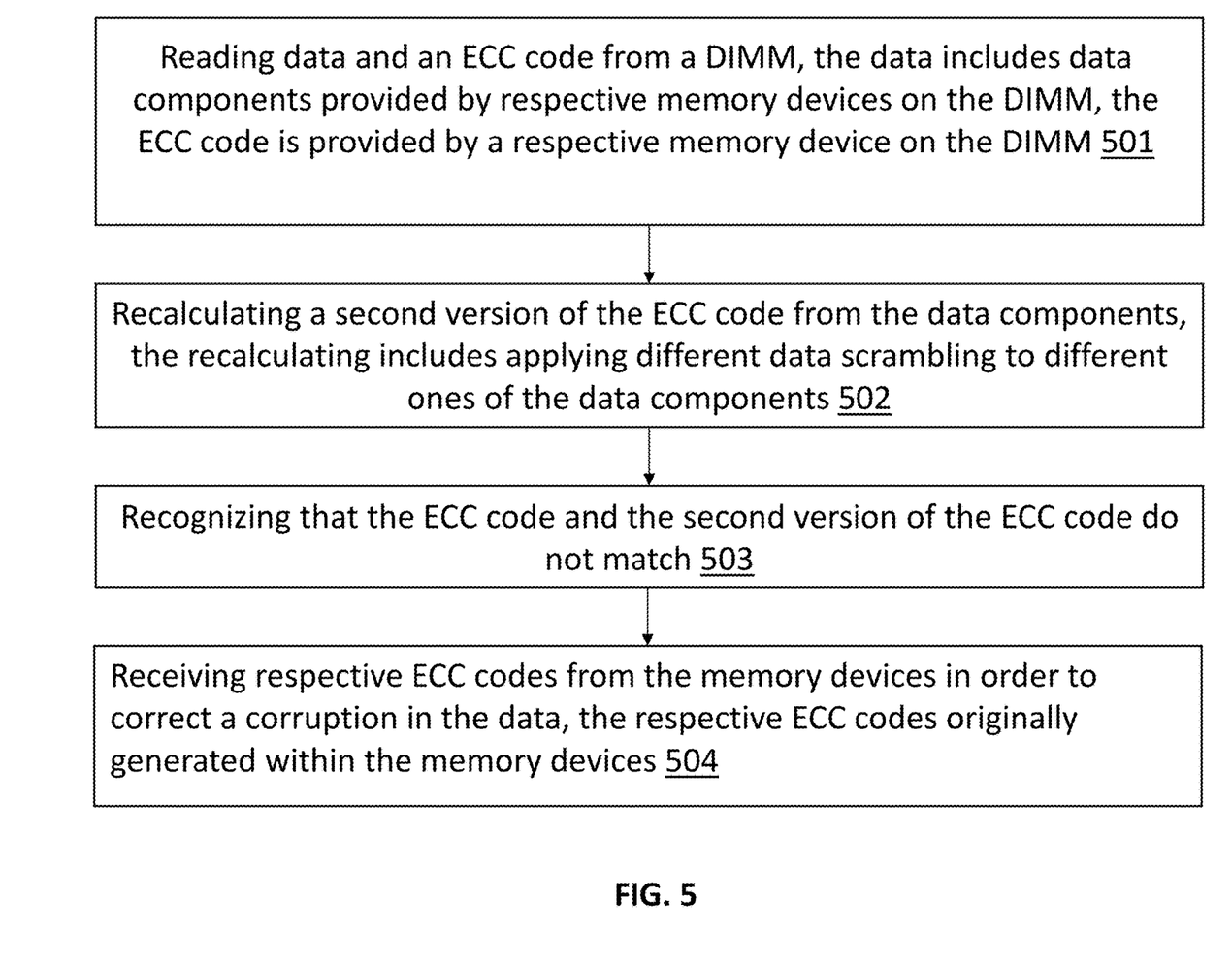
FIG. 5 shows an error checking process.

FIG. 5 shows a method described above. As observed in FIG. 5 the method includes reading 501 data and an ECC code from a DIMM. The data includes data components provided by respective memory devices on the DIMM. The ECC code is provided by a respective memory device on the DIMM. The method also includes recalculating 502 a second version of the ECC code from the data components. The recalculating includes applying different data scrambling to different ones of the data components. The method also includes recognizing 503 that the ECC code and the second version of the ECC code do not match. The method also includes receiving 504 respective ECC codes from the memory devices in order to correct a corruption in the data. The respective ECC codes were originally generated within the memory devices.

Figure 6:
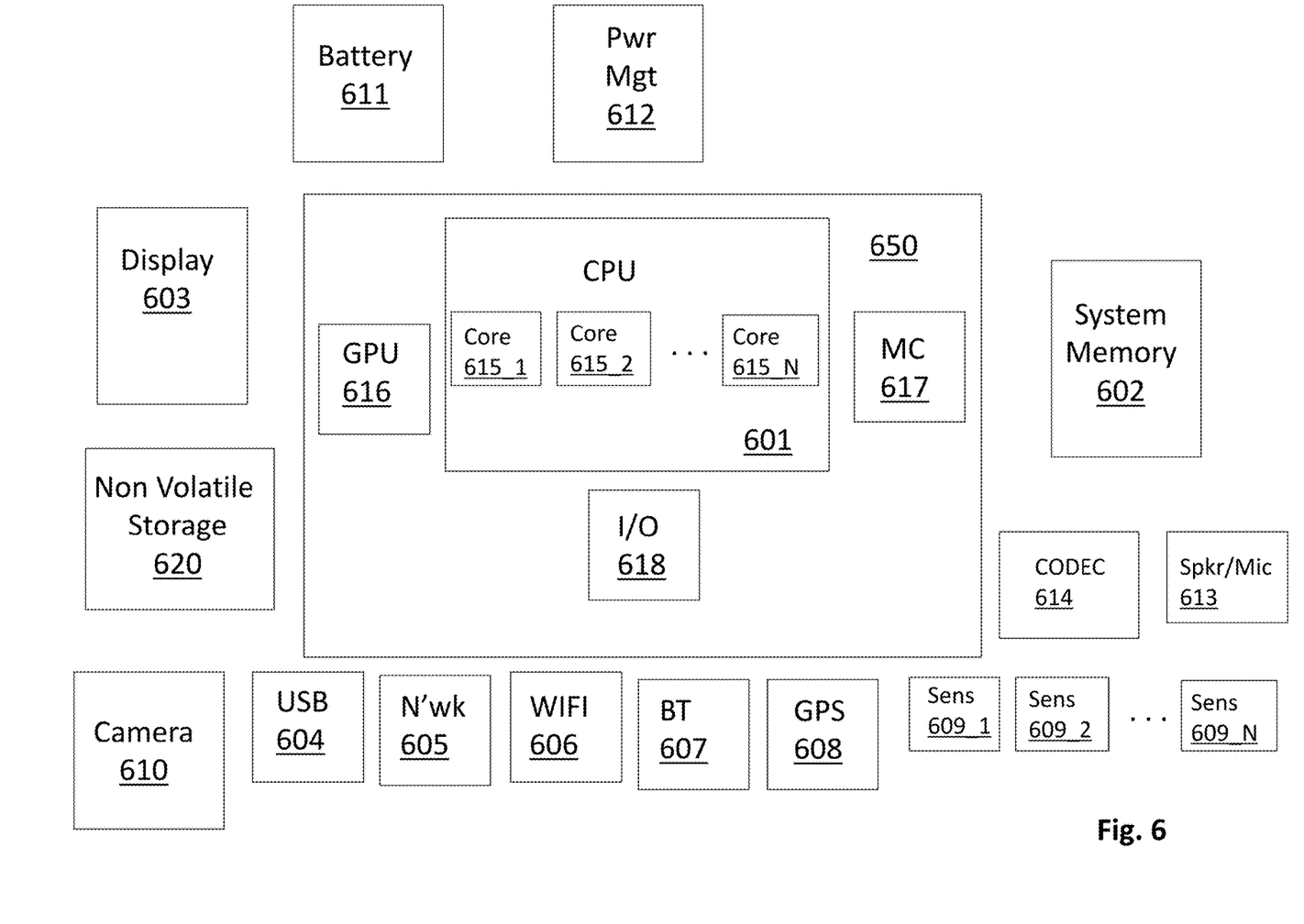
FIG. 6 shows a computing system.

FIG. 6 shows a basic model of a basic computing system which may represent any of the servers described above. As observed in FIG. 6, the basic computing system 600 may include a central processing unit 601 (which may include, e.g., a plurality of general purpose processing cores 615_1 through 615_X) and a main memory controller 617 disposed on a multi-core processor or applications processor, system memory 602, a display 603 (e.g., touchscreen, flat-panel), a local wired point-to-point link (e.g., USB) interface 604, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_Y, one or more cameras 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618. The general purpose processing cores 615 typically execute the operating system and application software of the computing system. The graphics processing unit 616 typically executes graphics intensive functions to, e.g., generate graphics information that is presented on the display 603. The memory control function 617 interfaces with the system memory 602 to write/read data to/from system memory 602. The power management control unit 612 generally controls the power consumption of the system 600.

The memory control function 617 (memory controller) may include error checking logic circuitry that can recover lost data using the internal error checking codes of the memory devices that it reads/writes from/to as discussed at length above.

Each of the touchscreen display 603, the communication interfaces 604-1107, the GPS interface 608, the sensors 609, the camera(s) 610, and the speaker/microphone codec 613, 614 all can be viewed as various forms of I/O (input and/or output) relative to the overall computing system including, where appropriate, an integrated peripheral device as well (e.g., the one or more cameras 610). Depending on implementation, various ones of these I/O components may be integrated on the applications processor/multi-core processor 650 or may be located off the die or outside the package of the applications processor/multi-core processor 650.

The computing system may also include a system memory (also referred to as main memory) having multiple levels. For example a first (faster) system memory level may be implemented with DRAM and a second (slower) system memory may be implemented with an emerging non-volatile memory (such as non-volatile memory whose storage cells are composed of chalcogenide, resistive memory (RRAM), ferroelectric memory (FeFRAM), etc.). Emerging non volatile memory technologies have faster access times that traditional FLASH and can therefore be used in a system memory role rather than be relegated solely to mass storage.

Software and/or firmware executing on a general purpose CPU core (or other functional block having an instruction execution pipeline to execute program code) of processor may perform any of the functions described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:
a host side memory controller disposed on a same semiconductor chip as a host CPU comprised of a plurality of processing cores, the memory controller to receive data from a volatile memory device, the memory controller comprising error checking logic circuitry, the error checking logic circuitry to receive an exposable error checking code from the volatile memory device, the exposable error checking code originally generated within the volatile memory device from the data, the error checking logic circuitry comprising circuitry to generate a second version code that is a second version of the exposable error checking code from the data that was received from the volatile memory device and compare the received exposable error checking code with the second version code to understand if the data that was received from the memory controller is corrupted.

2. The apparatus of claim 1 wherein the volatile memory device is disposed on a ×4 DIMM.

3. The apparatus of claim 1 wherein the volatile memory device is disposed on a x8 DIMM.

4. The apparatus of claim 1 wherein the exposable error checking code is an SEC code.

5. The apparatus of claim 1 wherein the data is received in multiple data read bursts.

6. The apparatus of claim 1 wherein the error checking logic circuitry further comprises ECC code generation circuitry to generate an ECC code from the data that was received from the volatile memory device and other components of data that were received from other volatile memory devices on a same DIMM as the volatile memory device.

7. The apparatus of claim 6 wherein the exposable error checking code is received by the memory controller in response to the ECC code and a corresponding ECC code that was read from the DIMM for the data and the other components of data not matching.

8. The apparatus of claim 7 wherein, if a corresponding second version code for each memory device matches each corresponding exposable error checking code received from the volatile memory device and the other memory devices, the error checking logic circuitry applies an inverse of a first scramble that is customized for a first of the volatile memory devices to a second scramble that is customized for a second of the volatile memory devices of corrupted received data.

9. The apparatus of claim 6 wherein the error checking logic circuitry is to implement the ECC code by applying a different data scramble to respective data of the volatile memory device and the other memory devices.

10. The apparatus of claim 1 wherein the error checking logic circuitry is to apply a BIST sequence if corrupted data was not correctable using the exposable error checking code.

11. A computing system, comprising:
a plurality of processing cores;
a main memory comprising a DIMM having a volatile memory device;
a memory controller integrated on a same semiconductor chip as the plurality of processing cores, the memory controller coupled to the DIMM, the memory controller to receive data from the volatile memory device, the memory controller comprising error checking logic circuitry, the error checking logic circuitry to receive an exposable error checking code from the volatile memory device, the exposable error checking code originally generated within the volatile memory device from the data, the error checking logic circuitry comprising circuitry to generate a second version code that is a second version of the exposable error checking code from the data that was received from the volatile memory device and compare the received error checking code with the second version code to understand if the data that was received from the memory controller is corrupted.

12. The computing system of claim 11 wherein the volatile memory device is disposed on a x4 DIMM.

13. The computing system of claim 11 wherein the volatile memory device is disposed on a x8 DIMM.

14. The computing system of claim 11 wherein the exposable error checking code is an SEC code.

15. The computing system of claim 11 wherein the data is received in multiple read data read bursts.

16. The computing system of claim 11 wherein the error checking logic circuitry further comprises ECC code generation circuitry to generate an ECC code from the data that was received from the volatile memory device and other components of data that were received from other volatile memory devices on a same DIMM as the memory device.

17. A method, comprising:
reading data and an ECC code from a DIMM, the data comprising data components provided by respective volatile memory devices on the DIMM, the ECC code provided by a respective volatile memory device on the DIMM;
recalculating a second version of the ECC code from the data components with a memory controller that is integrated on a same semiconductor chip as a plurality of processing cores, the recalculating comprising applying different data scrambling to different ones of the data components;
recognizing that the ECC code and the second version of the ECC code do not match; and,
receiving respective exposable ECC codes from the volatile memory devices in order to correct a corruption in the data, the respective exposable ECC codes originally generated on the data within the volatile memory devices.

18. The method of claim 17 wherein the DIMM is a x4 DIMM.

19. The method of claim 17 wherein the DIMM is a x8 DIMM.

20. The method of claim 17 wherein the ECC code is an SEC code.

* * * * *